(12) United States Patent
Zhang et al.

(10) Patent No.: US 8,112,880 B2
(45) Date of Patent: Feb. 14, 2012

(54) METHOD FOR MANUFACTURING MULTILAYER PRINTED CIRCUIT BOARDS

(75) Inventors: Hu-Hai Zhang, Shenzhen (CN); Ying Su, Shenzhen (CN); Cheng-Hsien Lin, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 487 days.

(21) Appl. No.: 12/342,205

(22) Filed: Dec. 23, 2008

(65) Prior Publication Data

US 2009/0229121 A1 Sep. 17, 2009

(30) Foreign Application Priority Data

Mar. 14, 2008 (CN) .......................... 2008 1 0300566

(51) Int. Cl.
*H05K 3/36* (2006.01)
*H05K 3/46* (2006.01)

(52) U.S. Cl. ............. 29/830; 29/829; 174/250; 174/254

(58) Field of Classification Search .................... 29/830, 29/829; 174/254, 250
See application file for complete search history.

(56) References Cited

U.S. PATENT DOCUMENTS 5,262,594 A * 11/1993 Edwin et al. .................. 174/254
* cited by examiner

*Primary Examiner* — Livius R Cazan
(74) *Attorney, Agent, or Firm* — Altis Law Group, Inc.

(57) ABSTRACT

A method for manufacturing a printed circuit board (PCB) includes: providing a first PCB substrate, a second PCB substrate and an adhesive layer, the first PCB substrate having a first main portion and a first unwanted portion divided by a first imaginary boundary, the second PCB substrate including a second main portion and a second unwanted portion divided by a second imaginary boundary; forming an opening in the adhesive layer; filling an filling mass in the opening; laminating the first PCB substrate, the second PCB substrate and the adhesive layer such that the adhesive layer is sandwiched between the first PCB substrate and the second PCB substrate, and the first, second imaginary boundaries are misaligned, a projection of each of the first and second imaginary boundaries in the adhesive layer being within the opening; and cutting the first and second PCB substrates along the first and second imaginary boundaries respectively.

3 Claims, 17 Drawing Sheets

(RLATED ART)

(RLATED ART)

(RLATED ART)

(RLATED ART)

(RLATED ART)

METHOD FOR MANUFACTURING MULTILAYER PRINTED CIRCUIT BOARDS

BACKGROUND

1. Technical Field

The present invention relates to a method for manufacturing a printed circuit board, and particularly to a method for manufacturing a multilayer printed circuit board having different flexibility in different areas.

2. Discussion of Related Art

Flexible printed circuit boards (FPCB) have been widely used in electronic products such as mobile phones, printing heads and hard disks. In these electronic products, some parts may move relative to a main body. In such condition, FPCBs are applied to provide electrical connections and signal transmissions between such parts and the main body due to their excellent flexibility. However, in some complex applications, there is a desire to provide a printed circuit board that is flexible in one end and is relative rigid in another end.

FIG. 1 shows a multilayer PCB structure 100, which has a first PCB substrate 110 and a second PCB substrate 120 having different length thereby forming a thick area 101 and a thin area 102 within the same PCB structure 100. The first and second PCB substrate 110, 120 are both flexible PCB substrate. It is to be understood that the thick area 101 has a higher circuit density, whilst the thin area 102 exhibits higher flexibility. To further increase a rigidity of the thick area 101, the PCB substrate 110 can also be a rigid PCB substrate.

Referring to FIGS. 2-5, during a manufacturing process of the PCB structure 100, firstly, a first PCB substrate 110, a second PCB substrate 120, and an adhesive layer 130 having a preformed opening 131 formed therein are laminated. As shown in FIG. 3, when a high pressure is applied on the first PCB substrate 110, the first PCB substrate 110 bends at the opening 131 and produces a concave portion 141 in an outer surface of the first PCB substrate 110. As shown in FIGS. 4 and 5, the concave portion 141 may cause a series of problems in sequential exposing, developing and etching step. For example, the obtained conductive traces 143 may have non-uniform line width or over etched. A stability of the obtained PCB deteriorates greatly.

Therefore, there is a desire to provide a method for manufacturing a multilayer printed circuit board having different thicknesses in different areas without decreasing quality of the printed circuit board.

SUMMARY

In one exemplary embodiment, a method for manufacturing a printed circuit board (PCB) includes the steps of: providing a first PCB substrate, a second PCB substrate and an adhesive layer, the first PCB substrate having a first main portion and a first unwanted portion divided by a first imaginary boundary, the second PCB substrate including a second main portion and a second unwanted portion divided by a second imaginary boundary; forming an opening in the adhesive layer; filling an filling mass in the opening; laminating the first PCB substrate, the second PCB substrate and the adhesive layer such that the adhesive layer is sandwiched between the first PCB substrate and the second PCB substrate, and the first, second imaginary boundaries are misaligned, a projection of each of the first and second imaginary boundaries in the adhesive layer being within the opening; and cutting the first and second PCB substrates along the first and second imaginary boundaries respectively.

This and other features and advantages of the present invention as well as the preferred embodiments thereof and a method for manufacturing a multilayer printed circuit board in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

A method for manufacturing a multilayer printed circuit board having different layers in different areas is provided.

Figure 1:
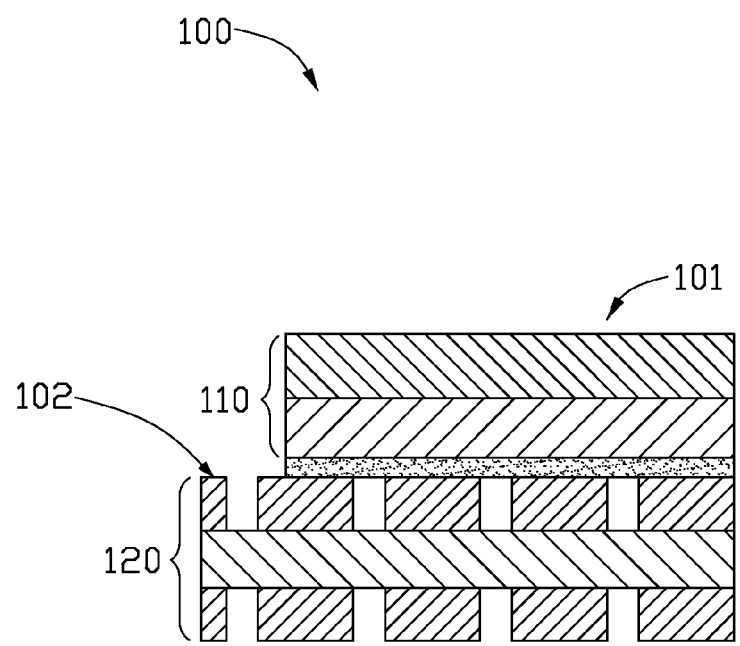
FIGS. 1-5 are schematic views of a conventional method for manufacturing a multilayer printed circuit board having different layers in different areas.
Figure 2:
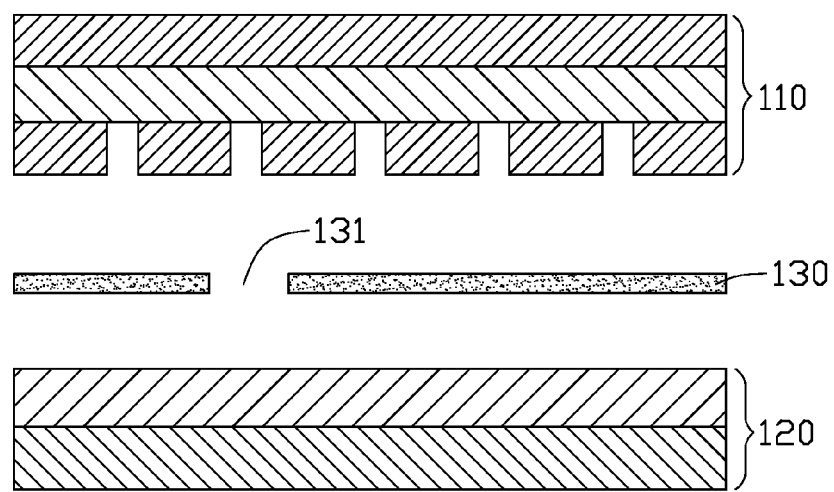
Figure 3:
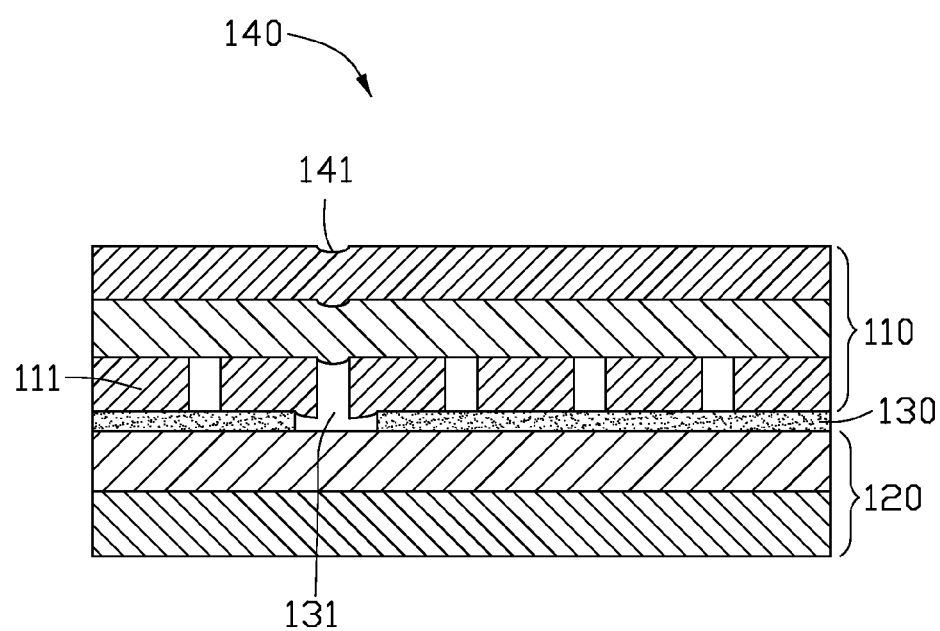
Figure 4:
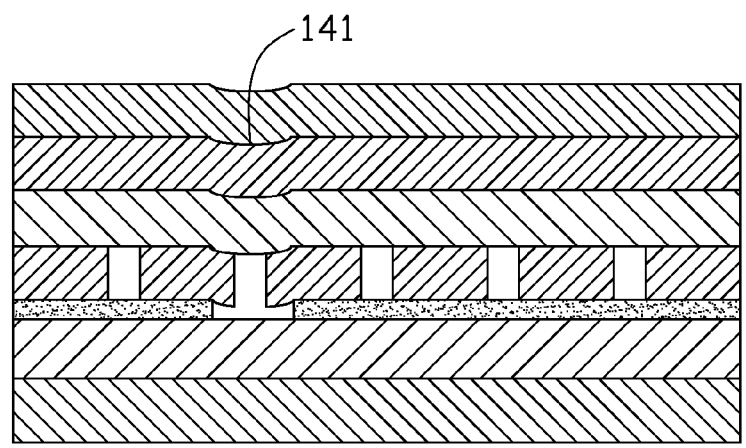
Figure 5:
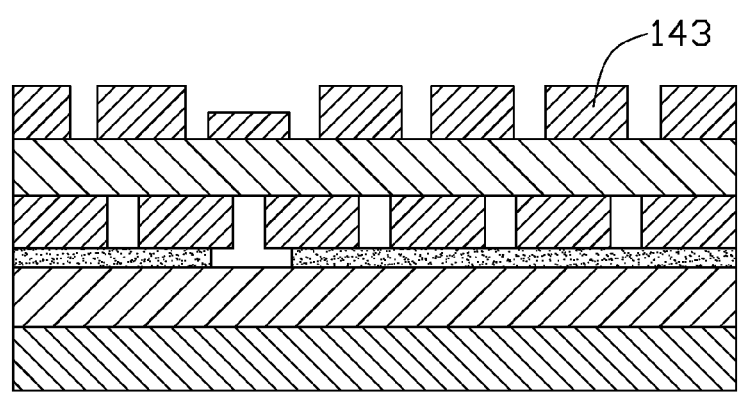
Figure 6:
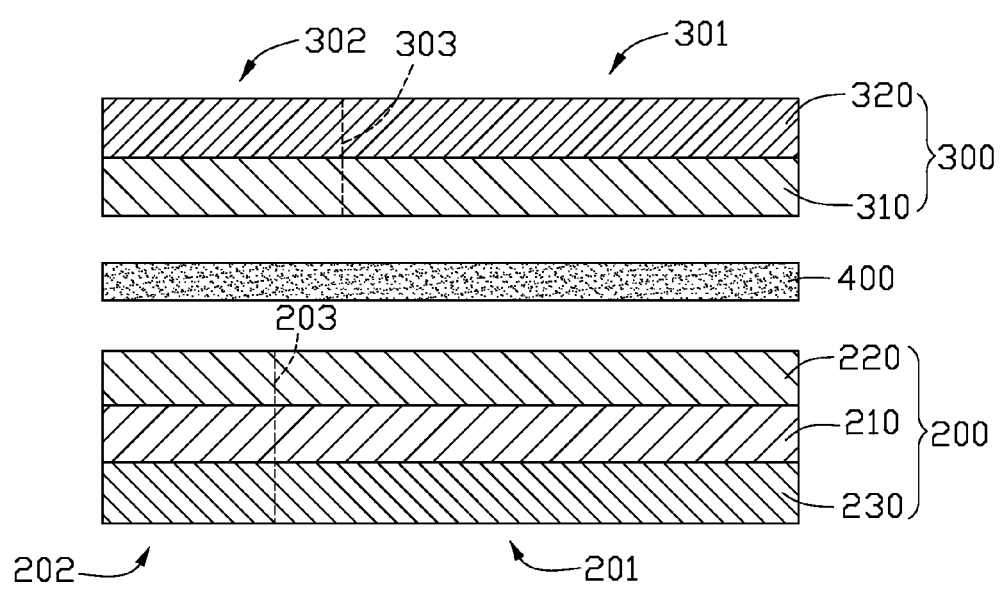
FIGS. 6-17 are schematic views showing sequential steps in a method for manufacturing a multilayer printed circuit board having different layers in different areas in accordance with a first embodiment.

Referring to FIG. 6, in step 1, a first PCB substrate 200, a second PCB substrate 300, and an adhesive layer 400 are provided.

The first PCB substrate 200 includes a first main portion 201 and a first unwanted portion 202 divided by a first imaginary boundary 203. The second PCB substrate 300 includes a second main portion 301 and a second unwanted portion 302 divided by a second imaginary boundary 303. In the present embodiment, the first imaginary boundary 203 and the second imaginary boundary 303 are planes. However, it is to be understood that the first imaginary boundary 203 and the second imaginary boundary 303 can also be curved, for example, cylinder surface shaped.

According to practical demand, the first PCB substrate 200 and the second PCB substrate 300 could be single-sided PCB substrates (i.e. a PCB substrate includes an insulating layer and a metallic layer formed on a surface of the insulating layer), double-sided PCB substrates (i.e. a PCB substrate includes an insulating layer and two metallic layers formed on two opposite surfaces of the insulating layer), or multilayer PCB substrates (i.e. a PCB substrate made by laminating a number of single-sided PCB substrates, double-sided PCB substrates or combination thereof.

In the present embodiment, the first PCB substrate 200 is a double-sided PCB substrate, and the second PCB substrate 300 is a single-sided PCB substrate. The first PCB substrate 200 includes a first insulating layer 210, a first metallic layer 220 and a second metallic layer 230 formed on two opposite surfaces of the first insulating layer 210. The second PCB substrate 300 includes a second insulating layer 310 and a third metallic layer 320 formed on a surface of the second insulating layer 310.

According to practical requirements, the first PCB substrate 200 and the second PCB substrate 300 may be rigid PCB substrates or flexible PCB substrates. Generally, rigid PCB substrates includes insulating layers made of a relative rigid material such as fiber glass cloth, and flexible PCB substrates includes flexible insulating layers made of a flexible material such as polyimide, polytetrafluoroethylene, polythiamine, polymethacrylic acid, polycarbonate, polycarbonate ester, polyester, copolymer of imide, ethylene and dimethyl terephthate. To improve flexibility, roll-annealed copper is usually employed in flexible PCB substrate. In the present embodiment, the first PCB substrate 200 is flexible PCB substrate, and the second PCB substrate 300 is rigid PCB substrate. The first metallic layer 220 and the second metallic layer 230 are made of roll-annealed copper.

The adhesive layer 400 is configured for bonding the first PCB substrate 200 and the second PCB substrate 300 together. The adhesive layer 400 is selected from common binders used in manufacturing of PCBs such as epoxy resin binder.

Figure 7:
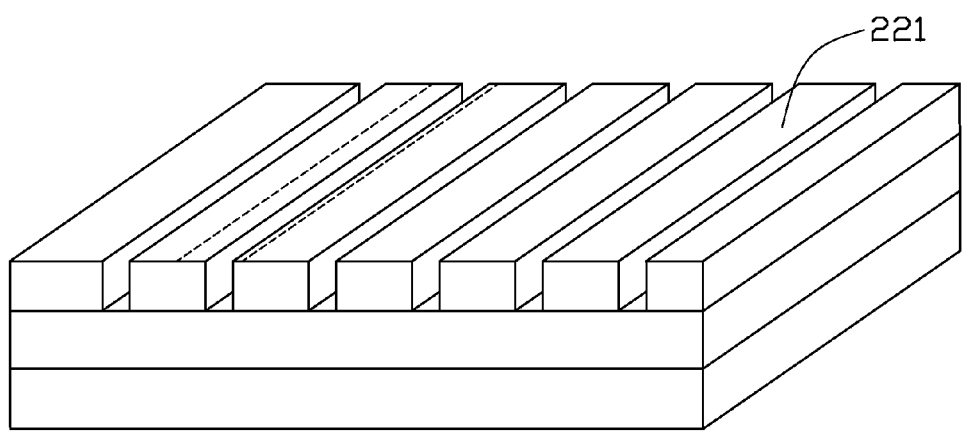

Referring to FIG. 7, in step 2, a number of first conductive traces 221 are formed in the first metallic layer 220. In the present embodiment, the conductive traces 221 are made using a wet process. Specifically, a photoresist is applied on the metallic layer 200. A lithography process is performed on the photoresist so as to obtain a predetermined photoresist pattern and the metallic layer 220 is etched in an etchant to form the conductive traces 221.

Figure 8:
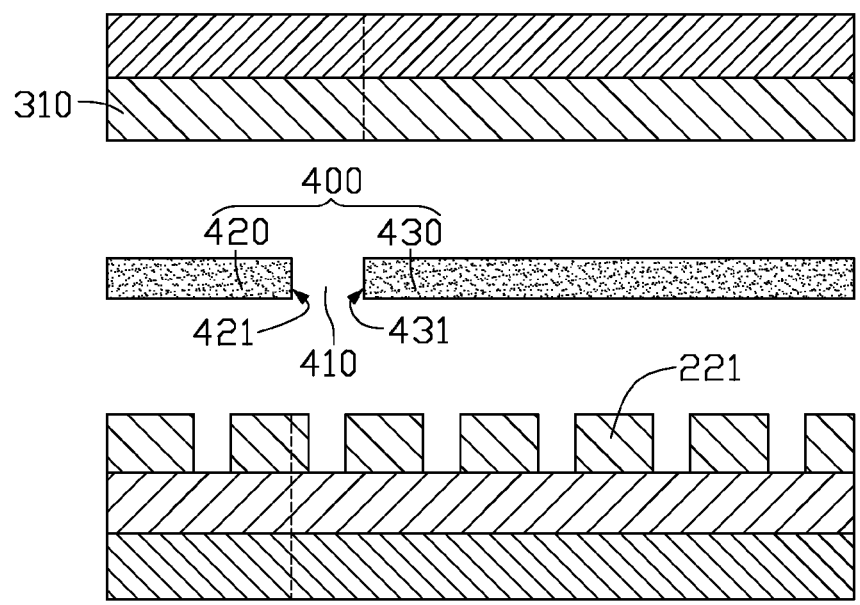

As shown in FIG. 8, in step 3, an opening 410 is defined in the adhesive layer 400. The adhesive layer 400 includes a first inner edge 421 and an opposite second inner edge 431. The first and second inner edges 421, 431 are at opposite sides of the opening 410. Suitable process for forming the opening 410 includes stamping and laser cutting. The opening 410 divides the adhesive layer 400 into a first portion 420 and a second portion 430. In the present embodiment, the opening 410 extends through two side surfaces of the adhesive layer 400. That is, the first portion 420 and the second portion 430 space apart from each other.

Figure 9:
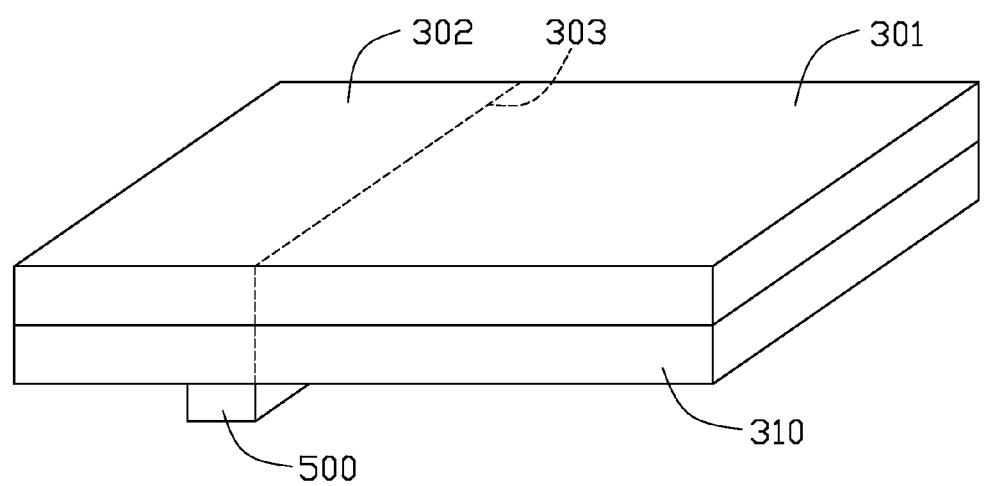
Figure 10:
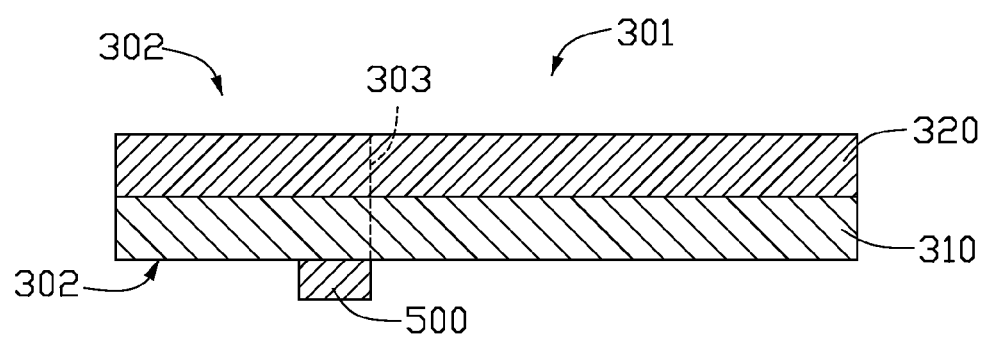

Referring to FIGS. 9 and 10, in step 4, an filling mass 500 is attached to the third metallic layer 310 of the second PCB substrate 300. The filling mass 500 is made of a non-glutinous material such as rubber, silicone rubber, polycarbonate, and polypropylene. That is, when the filling mass 500 is pressed on the first PCB substrate 200 or the second PCB substrate 300, the filling mass 500 can still be easily removed. In the present embodiment, the filling mass 500 has a same shape with the opening 410 and a thickness of the filling mass 500 is substantially equal to a thickness of the adhesive layer 400. Therefore, when the filling mass 500 is received in the opening 410, the filling mass 500 fully fills the opening 410. However, it is to be understood that the filling mass 500 can also have a thickness less or greater that the thickness of the adhesive layer 400. The filling mass 500 is attached to the second unwanted portion 302 and a side surface of the filling mass 500 is aligned with the second imaginary boundary 303.

Figure 11:
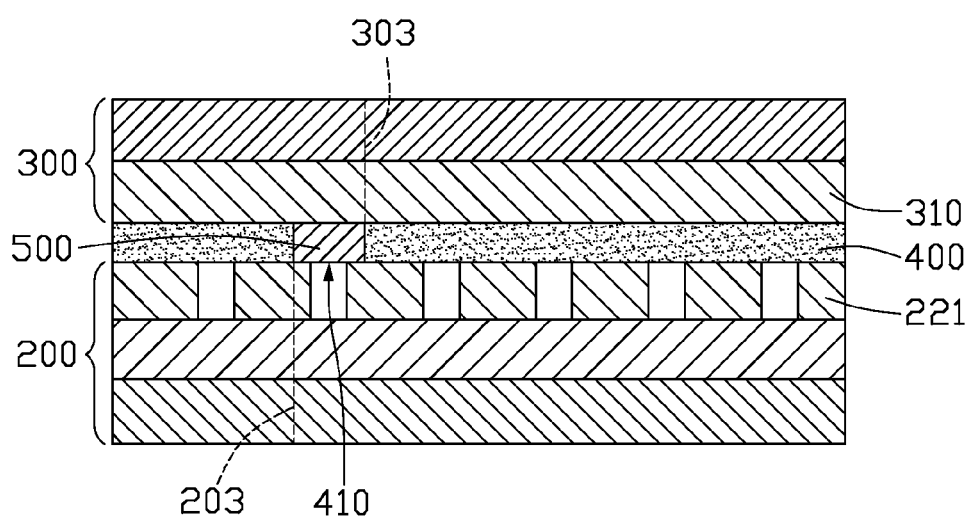

In step 5, referring to FIG. 11, the first PCB substrate 200, the second PCB substrate 300 and the adhesive layer 400 are laminated together. The adhesive layer 400 is sandwiched between the first PCB substrate 200 and the second PCB substrate 300. The filling mass 500 is received in the opening 410. The second insulating layer 310 and the conductive traces 221 are in contact with two opposite surfaces of the adhesive layer 400 respectively. The first and second imaginary boundaries 203, 303 are aligned with opposite side surface of the filling mass 500 respectively. As a result, the first imaginary boundary 203 misaligns with the second imaginary boundary 303. In addition, projections of the first and second imaginary boundaries 203, 303 toward the adhesive layer 400 fall within the opening 410. In the present embodiment, the first imaginary boundary 203 is aligned with the first inner edge 421 of the adhesive layer 400, and the second imaginary boundary 303 is aligned with the second inner edge 431 of the adhesive layer 400. In the present step, the first PCB substrate 200 and the second PCB substrate 300 are supported by the filling mass 500 during the laminating process. As a result, the first PCB substrate 200 and the second PCB substrate 300 don't bend at the opening 410.

Figure 12:
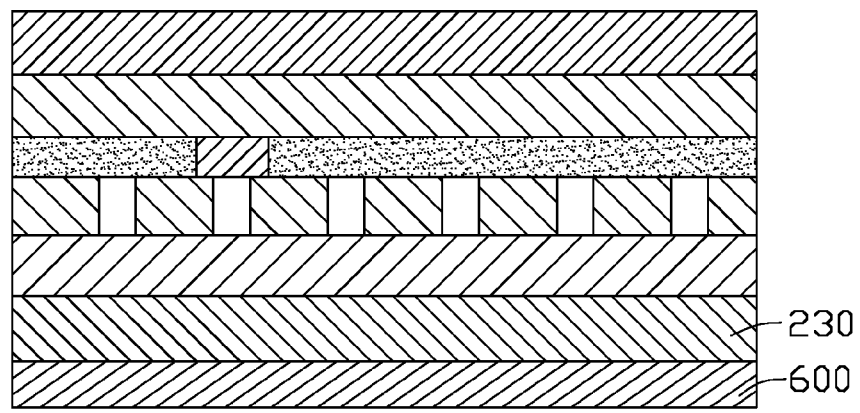
Figure 13:
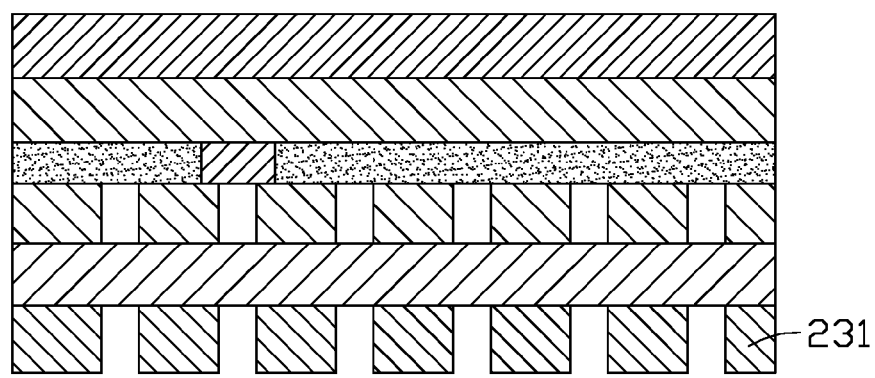
Figure 14:
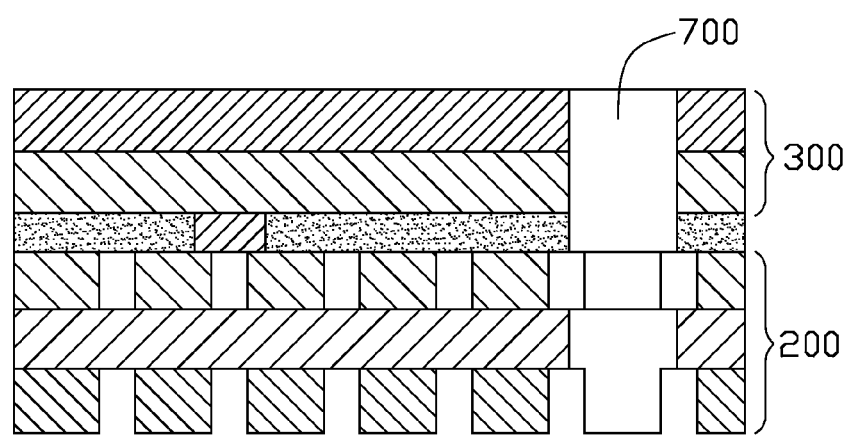

In step 6, referring together with FIGS. 12 and 13, a number of second conductive traces 231 are formed in the second metallic layer 230. Similar to the first conductive traces 221, the conductive traces 231 are also formed by a wet process. Specifically, a photoresist 600 is applied on the metallic layer 230. A lithography process is performed on the photoresist 600 so as to obtain a predetermined photoresist pattern and the metallic layer 230 is etched in an etchant to form the conductive traces 231. In addition, as shown in FIG. 14, a conductive through hole 700 can be formed prior to or after forming the conductive traces 231. The conductive through hole 700 is configured for electrically connecting the first PCB substrate 200 to the second PCB substrate 300.

Figure 15:
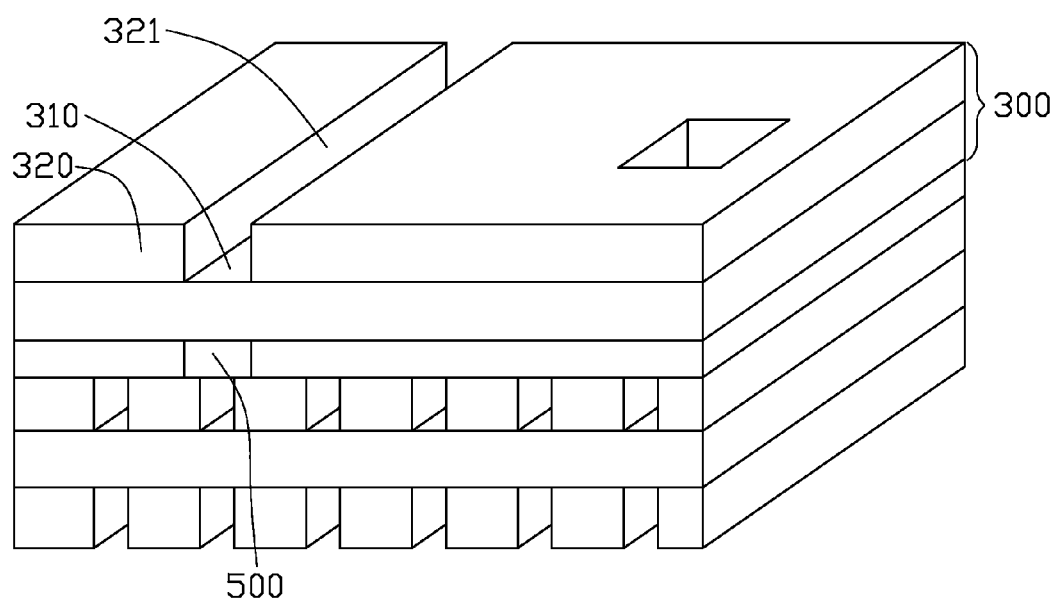
Figure 16:
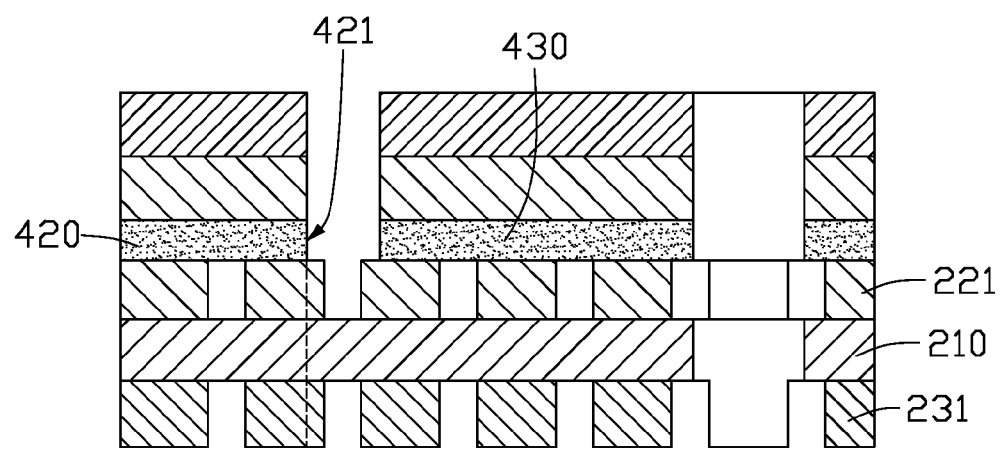
Figure 17:
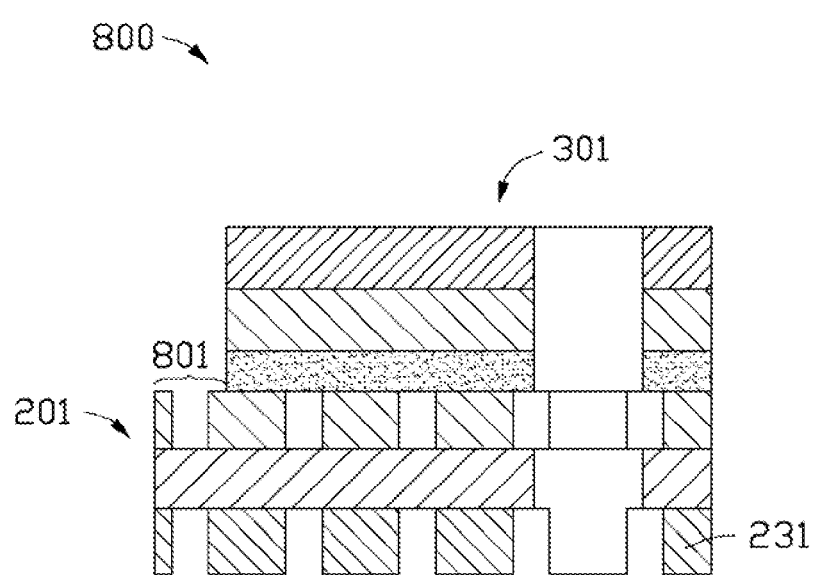

In step 7, referring to FIGS. 15 to 17, the first PCB substrate 200 and the second PCB substrate 300 are cut along the first imaginary boundary 203 and the second imaginary boundary 303 respectively. Because the filling mass 500 is made of a non-glutinous material and the first portion 420, the second portion 430 of the adhesive layer 400 is separated form each other, the first unwanted portion 202 and the second unwanted portion 302 can be easily removed after the present step. As such, referring to FIG. 17, a printed circuit board 800 having a mounting area 801 in a surface of the first main portion 201 exposed from the second main portion 301 is obtained. It is to be understood that if the first imaginary boundary 203 is parallel with the second imaginary boundary 303 in the step 5, the mounting area 801 is rectangular, and if the first imaginary boundary 203 is a cylinder surface the mounting area 801 may be in a semi-circular like shape.

The first PCB substrate 200 and the second PCB substrate 300 can be cut using a mold, a laser, or an etching process. For example, as shown in FIG. 15, the metallic layer 320 in the second PCB substrate 300 is etched using an etchant. After the etching step, a through groove 321 is formed and the second insulating layer 310 is exposed from the through groove 321. The second insulating layer 310 may be cut using a laser or an etching process. Generally, Nd:YAG laser has a relative short wave length and can be used to cut metallic layers and insulating layers. $CO_2$ laser has a relative long wave length and can be used to cut insulating layer. Therefore, the insulating layer 310 can be cut using a Nd:YAG laser or a $CO_2$ laser. The Nd:YAG laser can be used to replace the etching step for cutting the metallic layer 320.

In the present method for manufacturing a printed circuit board, an filling mass 500 is used to fill the opening 410 in the adhesive layer 400. The first PCB substrate 200 and the second PCB substrate 300 are supported by the filling mass 500 after the first PCB substrate 200, the second PCB substrate 300 and the adhesive layer 400 are laminated together. As a result, the first PCB substrate 200 and the second PCB substrate 300 don't bend at the opening 410, and a quality of the obtained printed circuit board 800 is improved.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for manufacturing a printed circuit board (PCB), comprising:
providing a first PCB substrate, a second PCB substrate and an adhesive layer, the adhesive layer having a first side and a second side opposite the first side, the first PCB substrate comprising a first main portion and a first unwanted portion, the first main portion and the first unwanted portion being divided by a first imaginary boundary, the second PCB substrate comprising a second main portion and a second unwanted portion, the second main portion and the second unwanted portion being divided by a second imaginary boundary;

defining an opening in the adhesive layer, the adhesive layer having a first inner edge and a second inner edge, the first and second inner edges being at opposite sides of the opening;

filling the opening using a filling mass, the filling mass having a first side and a second side opposite the first side;

laminating the first PCB substrate and the second PCB substrate directly on the adhesive layer in such a manner that a portion of the first imaginary boundary is aligned with the first inner edge, a portion of the second imaginary boundary is aligned with the second inner edge of the adhesive layer, the first PCB substrate is directly contacting the first sides of the adhesive layer and the filling mass, and the second PCB substrate is directly contacting the second sides of the adhesive layer and the filling mass; and removing the first and second unwanted portions from the first and second PCB substrates along the first and second imaginary boundaries respectively.

2. The method for manufacturing a printed circuit board as claimed in claim 1, wherein the filling mass is attached to the second PCB substrate prior to the step of filling the opening, and the filling mass is received in the opening when the first PCB substrate, the second PCB substrate, and the adhesive layer are laminated together.

3. The method for manufacturing a printed circuit board as claimed in claim 1, wherein the filling mass is comprised of a material selected from the group consisting of rubber, silicone rubber, polycarbonate, and polypropylene.

* * * * *